United States Patent
Nguyen (10) Patent No.: US 8,390,969 B2
(45) Date of Patent: Mar. 5, 2013

(54) SMOKE-FREE ESD PROTECTION STRUCTURE USED IN INTEGRATED CIRCUIT DEVICES

(75) Inventor: James Nguyen, San Jose, CA (US)

(73) Assignee: Monolithic Power Systems, Inc., San Jose, CA (US)

(*) Notice: Subject to any disclaimer, the term of this patent is extended or adjusted under 35 U.S.C. 154(b) by 483 days.

(21) Appl. No.: 12/834,771

(22) Filed: Jul. 12, 2010

(65) Prior Publication Data
US 2012/0007138 A1    Jan. 12, 2012

(51) Int. Cl.
*H02H 9/00* (2006.01)
(52) U.S. Cl. .......................... 361/56; 361/111
(58) Field of Classification Search .............. 361/56, 361/111
See application file for complete search history.

(56) References Cited

U.S. PATENT DOCUMENTS

| | | | |
|---|---|---|---|
| 6,888,710 B2 * | 5/2005 | Mallikarjunaswamy et al. | 361/56 |
| 7,164,566 B2 * | 1/2007 | Xu et al. | 361/56 |

* cited by examiner

*Primary Examiner* — Rexford Barnie
*Assistant Examiner* — Tien Mai
(74) *Attorney, Agent, or Firm* — Perkins Coie LLP (57) ABSTRACT

The present invention provides a smoke-free ESD protection structure used in integrated circuit devices. A JFET or n-channel MOS transistor is coupled between an I/O pad, and a transistor and diode, wherein the JFET or n-channel MOS transistor limits the current flowing through the diode and transistor to prevent the integrated circuit device from heating up and catching on fire or smoke during the smoke test. Moreover, the integrated circuit device will not be damaged by the smoke test.

9 Claims, 8 Drawing Sheets

SMOKE-FREE ESD PROTECTION STRUCTURE USED IN INTEGRATED CIRCUIT DEVICES

TECHNICAL FIELD

The present invention generally relates to integrated circuit devices, and more particularly, relates to an electrostatic discharge (ESD) protection structure used in integrated circuit devices.

BACKGROUND

In applications where the input voltage is high, integrated circuit devices may need to pass a "smoke test". During the test, each input or output (I/O) pin of the integrated circuit device is connected to a high DC voltage, and if the device does not catch fire or smoke, then that particular pin passes the test.

Figure 1:
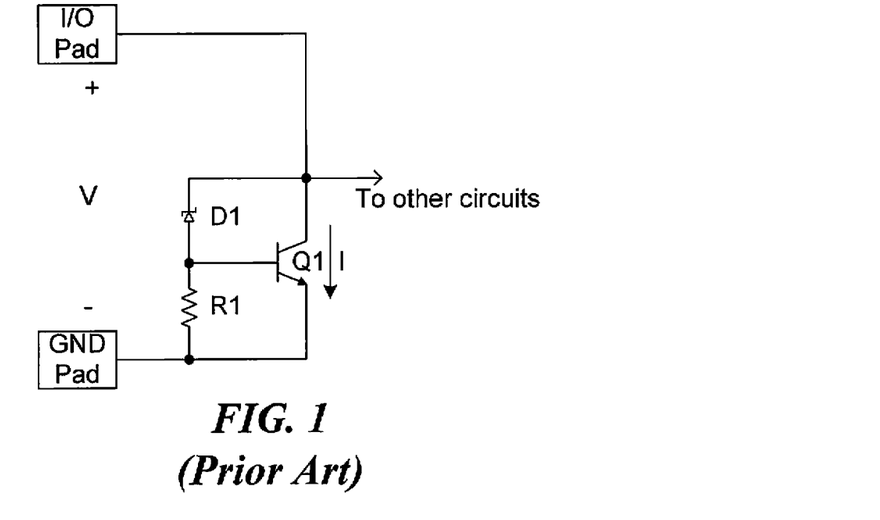
FIG. 1 illustrates a prior ESD protection structure used in integrated circuit devices.

Conventionally, ESD protection structures are used in integrated circuit devices to protect circuitry from being damaged due to electrical static discharge experienced at the I/O pins of the device. A prior ESD protection structure is illustrated in FIG. 1. It comprises a Zener diode D1, a NPN bipolar transistor Q1 and a resistor R1, connected as shown in the figure. The I/O pad and the ground (GND) pad are respectively coupled to the I/O pin and the GND pin.

Figure 2:
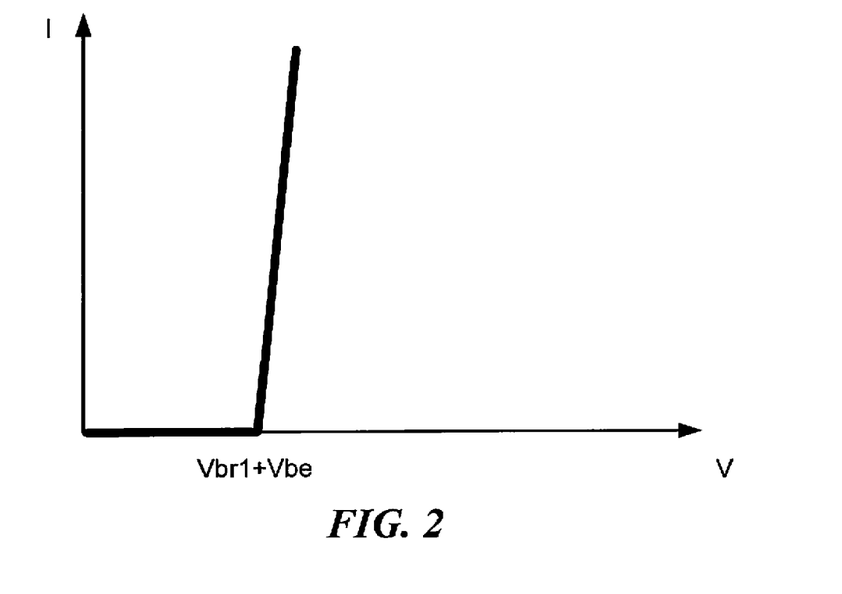
FIG. 2 is a current versus voltage waveform of the ESD protection structure shown in FIG. 1.

FIG. 2 is a waveform of the ESD protection structure shown in FIG. 1. The voltage between the I/O pad and GND pad (V) will almost be clamped at a voltage equaling to the breakdown voltage $V_{br1}$ of the Zener diode D1 plus the base to emitter voltage Vbe of transistor Q1. If for a short duration, an ultra-high electrical static voltage, which may be thousands of volts or even higher, is applied between the I/O pin and the GND pin, this clamp voltage is low enough to protect the internal circuitry of the device. However, if the I/O pin is shorted to a DC input voltage (VIN) pin which receives a high voltage during operation, the device will heat up and likely catch fire or smoke due to the high current flowing through the ESD protection structure. Thus, the I/O pin will likely fail the smoke test.

Figure 3:
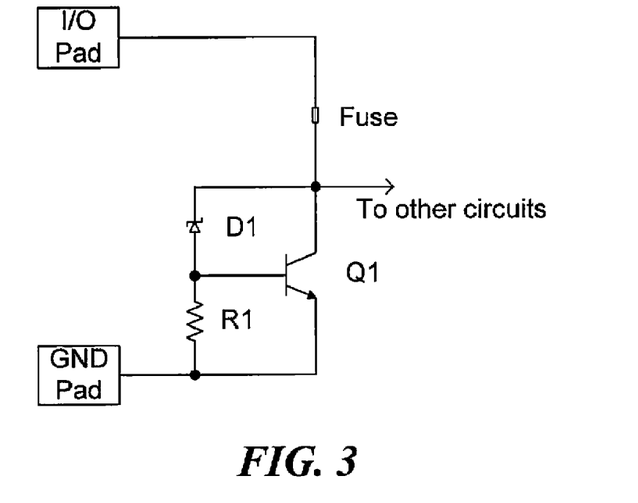
FIG. 3 illustrates a prior smoke-free ESD structure using a metal fuse.

One solution is coupling a metal fuse between the I/O pad and the ESD structure, as shown in FIG. 3. When the I/O pin is shorted to the VIN pin, the fuse will blow to disconnect the ESD structure from the I/O pad. Thus, the device is prevented from over heating and catching on fire or smoking. However, since the fuse is blown, the device is damaged and can not be further used. Furthermore, the metal fuse is unreliable since its width is very narrow and its breakdown current may widely vary.

SUMMARY

The present invention is directed to an ESD protection structure used in integrated circuit devices that will provide protection to the interior circuitry of the device, and that will sufficiently enable an I/O pin of the device to pass the smoke-free test. In an embodiment of the present disclosure, an ESD protection structure having a transistor M2; a diode; a transistor M1; and a resistor. The drain terminal of M2 is coupled to an I/O pad, and the gate and source terminals of M2 are coupled together. The cathode of the diode is coupled to the gate terminal of M2 and to the drain/collector terminal of M1. The gate/base terminal of M1 is coupled to the anode of the diode, and the source/emitter terminal of M1 is coupled to a GND pad. The resistor is coupled between the anode of the diode and a GND pad.

BRIEF DESCRIPTION OF THE DRAWING

The present invention can be further understood with reference to the following detailed description and the appended drawings, wherein like elements are provided with like reference numerals.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 4:
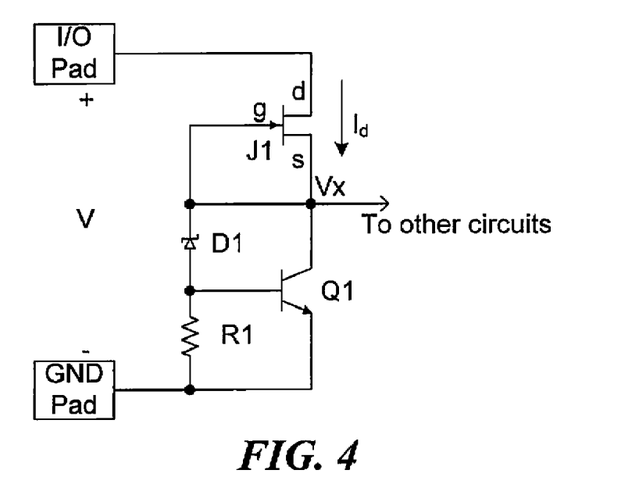
FIG. 4 illustrates a smoke-free ESD structure used in integrated circuit devices, in accordance with an embodiment of the present disclosure.

FIG. 4 illustrates a smoke-free ESD structure used in integrated circuit devices, in accordance with an embodiment of the present disclosure. An n-channel JFET J1 is added between the I/O pad and the prior ESD structure. The drain of the JFET J1 is coupled to the I/O pad. The gate and source of the JFET J1 are both coupled to the cathode of the diode D1 and the collector of the transistor Q1, and further coupled to other internal circuits of the integrated circuit device. The anode of the diode D1 and the base of the transistor Q1 are coupled together and coupled to one terminal of the resistor R1. The other terminal of the resistor R1 and the emitter of the transistor Q1 are coupled together, and coupled to the GND pad. During the smoke test, as long as the input voltage $V_{in}$ of the device is smaller than the breakdown voltage $V_{br2}$ of the JFET J1, the current $I_d$ flowing through the JFET J1 is limited by its saturation current $I_{sat}$. Thus, the device will not over heat and catch fire or smoke. Moreover, the device is not damaged by the test and can operate normally.

Figure 5:
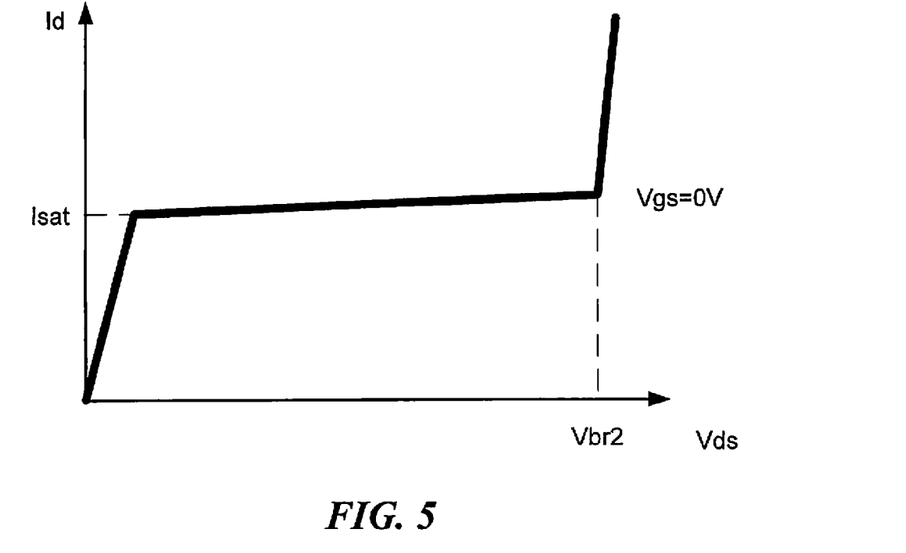
FIG. 5 is a current versus drain-source voltage waveform of the JFET shown in FIG. 4.

FIG. 5 is a waveform of the JFET J1 shown in FIG. 4, wherein $V_{ds}$ is the voltage between the drain and source of the JFET J1. Because the gate to source voltage Vgs is 0V, the JFET J1 is always on. As Vds increases, the drain current Id enters the pinch-off region and is equal to the JFET J1 saturation current of Isat. Drain current Id will go higher when drain to source voltage Vds reaches or exceeds the JFET J1 break down voltage Vbr2.

Figure 6:
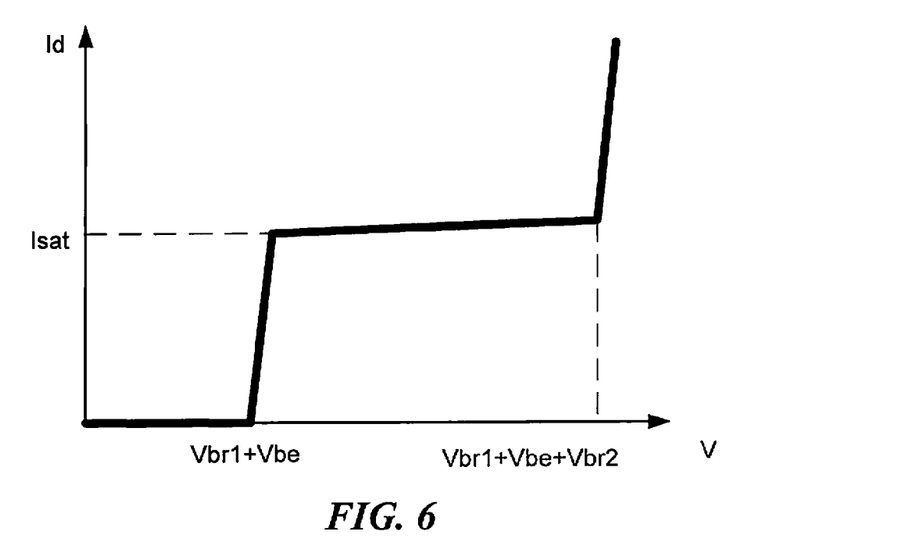
FIG. 6 is a current versus input voltage waveform of the smoke-free ESD structure shown in FIG. 4.

FIG. 6 is another waveform of the smoke-free ESD structure shown in FIG. 4. When the voltage at the I/O pin is lower than the sum of the breakdown voltage Vbr1 of the Zener diode Z1 plus the Vbe of transistor Q1, the current $I_d$ is small. When the voltage is larger than the sum of Vbr1 and Vbe, but smaller than the sum of the breakdown voltage Vbr2 of the JFET J1, Vbr1, and Vbe, the current is increased and limited to the saturation current $I_{sat}$ of the JFET J1. When the I/O voltage is larger than the sum of Vbr1, Vbe, and Vbr2, the JFET J1 breaks down and the device starts to over heat. Therefore it is preferable that the JFET is designed to have a drain to source break down voltage Vbr2 that is greater than the application maximum input voltage.

Figure 7:
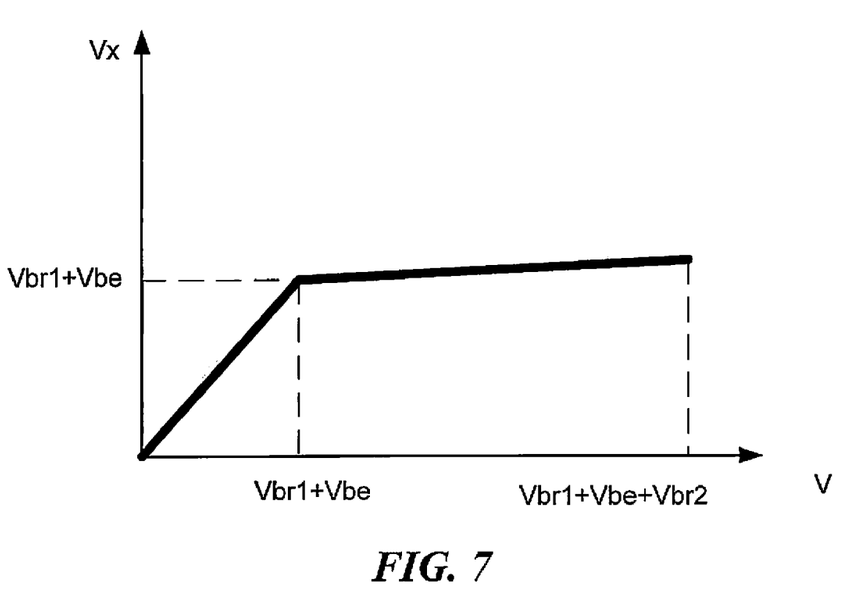
FIG. 7 is a waveform of the smoke-free ESD structure shown in FIG. 4.

FIG. 7 is a waveform of the smoke-free ESD structure shown in FIG. 4. It shows that the voltage Vx tracks the I/O voltage, and Vx is then clamped at Vbr1+Vbe when the I/O voltage $V_{inpad}$ becomes greater than Vbr1+Vbe.

Figure 8:
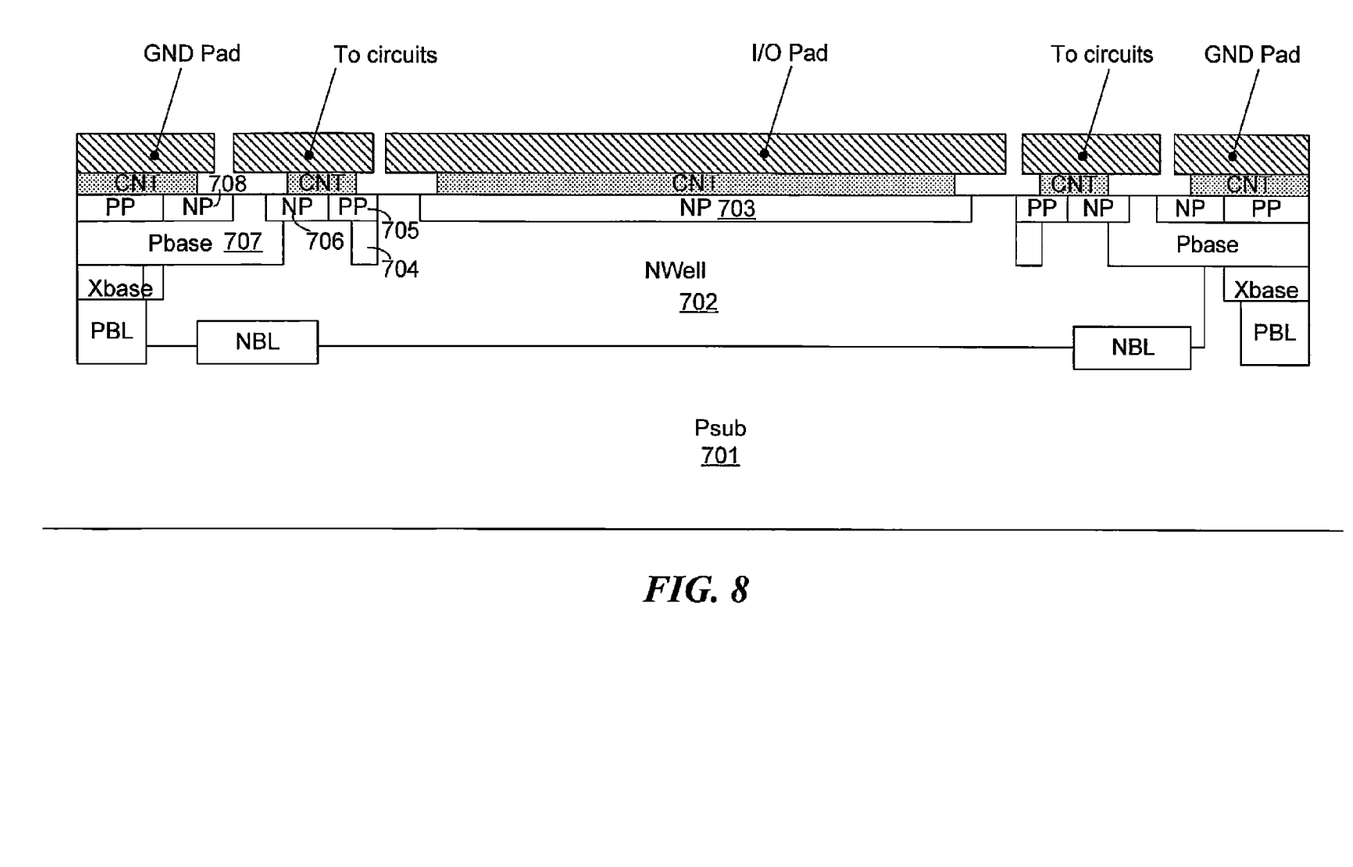
FIG. 8 is a cross section of the smoke-free ESD structure shown in FIG. 4, in accordance with an embodiment of the present disclosure.

FIG. 8 is a cross section of the smoke-free ESD structure shown in FIG. 4, in accordance with an embodiment of the present disclosure. The p-base 704 constructs the gate of the JFET J1 together with the p-substrate 701. The p-base 704 is coupled to the internal circuits through the p-plus region 705 and the contact. The region of the n-well 702 which is next to the n-plus region 706 construct the source of the JFET J1, and is coupled to the internal circuits through the n-plus region 706 and the contact CNT. The region of the n-well 702 which is next to the n-plus region 703 construct the drain of the JFET J1, and is coupled to the I/O pad through the n-plus region 703 and the contact CNT. The n-plus region 706, the p-base 707 and the n-plus region 708 construct the collector, base and emitter of the transistor Q1 respectively. The n-plus region 708 is coupled to the GND pad through the contact CNT. The p-base 707 and the n-plus region 706 further construct the anode and cathode of the Zener diode D1. The internal resistance of the p-base 707 constructs the resistor R1.

Figure 9:
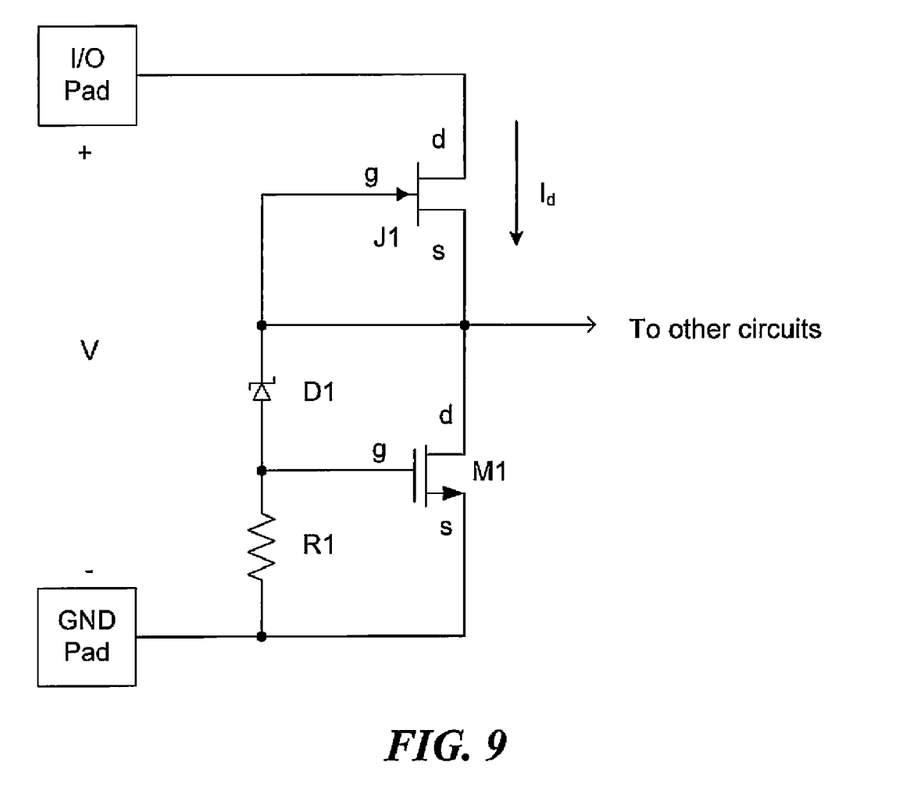
FIG. 9 illustrates a smoke-free ESD structure in accordance with an embodiment of the present disclosure.

FIG. 9 illustrates a smoke-free ESD structure used in integrated circuit devices, in accordance with an embodiment of the present disclosure. An n-channel MOSFET device is used in-lieu of the bipolar NPN transistor Q1 used in the embodiment shown in FIG. 4. The drain of the JFET J1 is coupled to the I/O pad. The gate and source of the JFET J1 are both coupled to the cathode of the diode D1 and the drain of transistor M1, and further coupled to other circuits of the integrated circuit device. The anode of the diode D1 and the gate of the transistor M1 are coupled together and coupled to one terminal of the resistor R1. The other terminal of the resistor R1 and the source of the transistor M1 are coupled together, and coupled to the GND pad. During the smoke test, as long as the input voltage $V_{in}$ of the device is smaller than the breakdown voltage $V_{br2}$ of the JFET J1, the current $I_d$ flowing through the JFET J1 is limited by its saturation current $I_{sat}$. Thus, the device will not over heat and catch fire or smoke. Moreover, the device is not damaged by the test and can operate normally.

Figure 10:
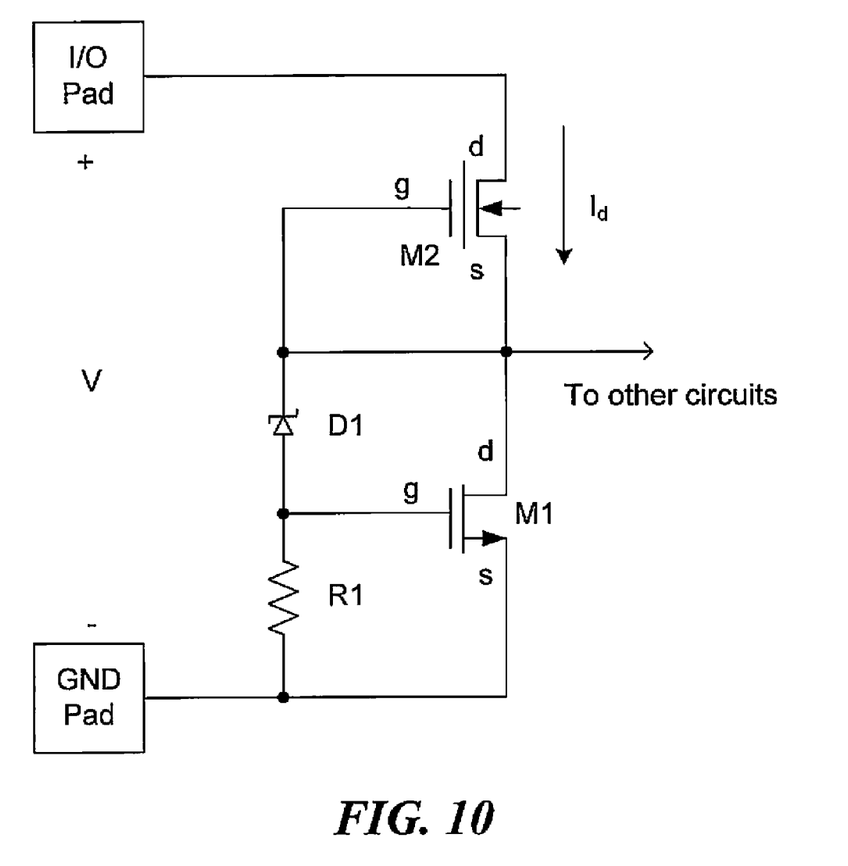
FIG. 10 illustrates a smoke-free ESD structure in accordance with an embodiment of the present disclosure.

FIG. 10 illustrates a smoke-free ESD structure used in integrated circuit devices, in accordance with an embodiment of the present disclosure. An n-channel depletion mode MOS-FET device M2 is used in-lieu of the JFET J1 used in the embodiment shown in FIG. 9. The drain of M2 is coupled to the I/O pad. The gate and source of M2 are both coupled to the cathode of the diode D1 and the drain of M1, and further coupled to other circuits of the integrated circuit device. The anode of the diode D1 and the gate of the transistor M1 are coupled together and coupled to one terminal of the resistor R1. The other terminal of the resistor R1 and the source of the transistor M1 are coupled together, and coupled to the GND pad. During the smoke test, as long as the input voltage $V_{in}$ of the device is smaller than the breakdown voltage $V_{br2}$ of M2, the current $I_d$ flowing through M2 is limited by its saturation current $I_{sat}$. Thus, the device will not over heat and catch fire or smoke. Moreover, the device is not damaged by the test and can operate normally.

Figure 11:
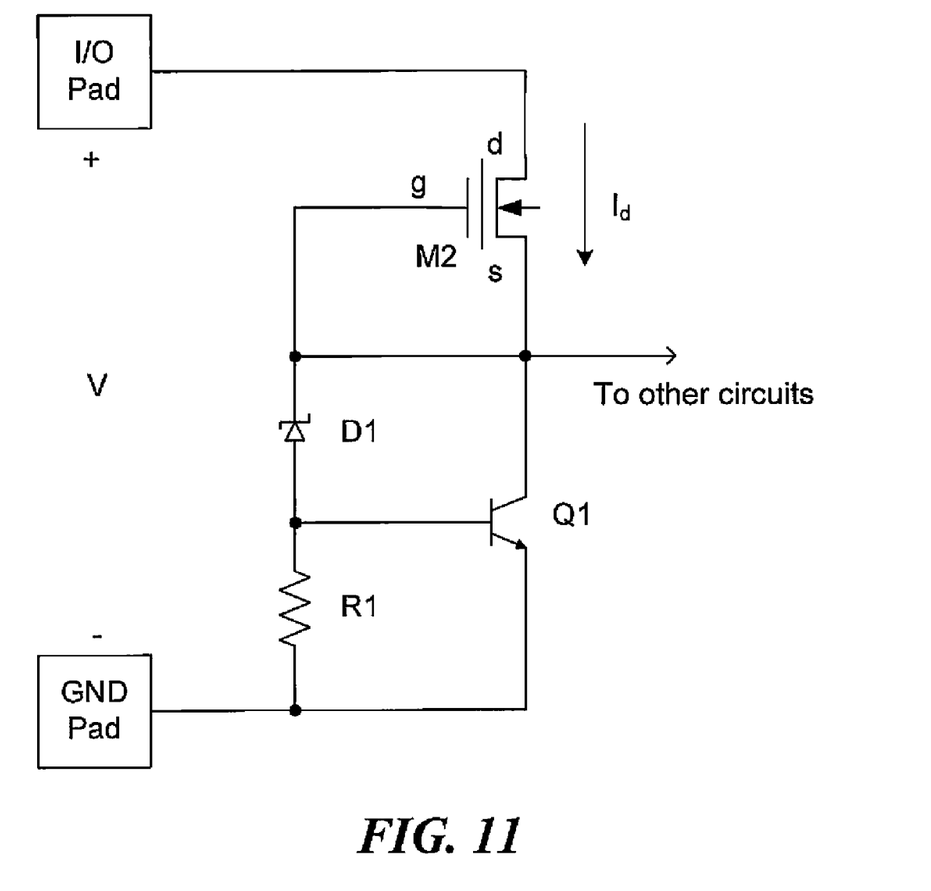
FIG. 11 illustrates a smoke-free ESD structure in accordance with an embodiment of the present disclosure.

FIG. 11 illustrates a smoke-free ESD structure used in integrated circuit devices, in accordance with an embodiment of the present disclosure. An n-channel depletion mode MOS-FET device M2 is used in-lieu of the JFET J1 used in the embodiment shown in FIG. 4. The drain of M2 is coupled to the I/O pad. The gate and source of M2 are both coupled to the cathode of the diode D1 and the collector of transistor Q1, and further coupled to other circuits of the integrated circuit device. The anode of the diode D1 and the base of the transistor Q1 are coupled together and coupled to one terminal of the resistor R1. The other terminal of the resistor R1 and the emitter of the transistor Q1 are coupled together, and coupled to the GND pad. During the smoke test, as long as the input voltage $V_{in}$ of the device is smaller than the breakdown voltage $V_{br2}$ of M2, the current $I_d$ flowing through M2 is limited by its saturation current $I_{sat}$. Thus, the device will not over heat and catch fire or smoke. Moreover, the device is not damaged by the test and can operate normally.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A ESD protection structure coupled between an I/O pad and a GND pad, the structure comprising:
    a JFET having a drain terminal, a gate terminal, and a source terminal, and having a drain-to-source break down voltage Vbr2, and having a drain-to-source saturation current of Isat, wherein the drain terminal is coupled to the I/O pad, and the gate and source terminals are coupled together, and wherein the JFET is activated, a JFET drain-to-source current is generated;
    a diode having a cathode terminal and an anode terminal, and having a break down voltage Vbr1, wherein the cathode terminal is coupled to the gate of the JFET;
    a transistor having a collector terminal, a base terminal, and an emitter terminal, wherein the collector terminal is coupled to the source terminal of the JFET, the base terminal is coupled to the anode terminal of the diode, and the emitter terminal is coupled to the GND pad, and wherein the transistor is activated, a voltage Vbe is developed between the base and emitter terminals;

a resistor coupled between the base terminal of the transistor and the GND pad; and wherein a voltage that is less than the sum of the Vbr1, Vbe, and Vbr2 voltages is applied between the I/O pad and the GND pad, the JFET drain-to-source current is limited to a maximum current level of Isat.

2. The ESD protection structure of claim 1 wherein the diode comprises a zener diode.

3. The ESD protection structure of claim 1 wherein the transistor comprises a NPN bipolar device.

4. The ESD protection structure of claim 1 wherein the transistor comprises a N-channel MOS device, the MOS device comprising:
- a drain terminal corresponding to the collector terminal of the transistor;
- a gate terminal corresponding to the base terminal of the transistor; and
- a source terminal corresponding to the emitter terminal of the transistor.

5. The ESD structure of claim 1 wherein the JFET comprises an N-channel JFET device.

6. The ESD protection structure of claim 3 wherein the diode comprises a zener diode, and wherein the JFET comprises an N-channel JFET device, and further wherein a voltage that is less than the sum of the Vbr1, Vbe, and Vbr2 voltages is applied between the I/O pad and the GND pad, the source terminal of the JFET is clamped to a voltage substantially equal to the sum of the Vbr1 and Vbe voltages.

7. The ESD protection structure of claim 5 wherein the diode comprises a zener diode, and wherein a voltage that is less than the sum of the Vbr1, Vbe, and Vbr2 voltages, but greater than the sum of the Vbr1 and Vgs voltages, is applied between the I/O pad and the GND pad, the source terminal of the JFET is clamped to a voltage substantially equal to the sum of the Vbr1 and Vgs voltages, and further wherein the transistor is a N-channel MOS device, the MOS device comprising:
- a drain terminal corresponding to the collector terminal of the transistor;
- a gate terminal corresponding to the base terminal of the transistor; and
- a source terminal corresponding to the emitter terminal of the transistor.

8. A ESD protection structure coupled between an I/O pad and a GND pad, the structure comprising:
- a n-channel depletion mode MOS transistor having a drain terminal, a gate terminal, and a source terminal, and having a drain-to-source break down voltage Vbr2, and having a drain-to-source saturation current of Isat, wherein the drain terminal is coupled to the I/O pad, and the gate and source terminals are coupled together;
- a zener diode having a cathode terminal and an anode terminal, and having a break down voltage Vbr1, wherein the cathode terminal is coupled to the gate of the JFET;
- a n-channel MOS transistor having a drain terminal, a gate terminal, and a source terminal, wherein the drain terminal is coupled to the source terminal of the n-channel depletion mode MOS transistor, the gate terminal is coupled to the anode terminal of the diode, and the source terminal is coupled to the GND pad, and wherein the transistor is activated, a voltage Vgs is developed between the gate and source terminals;
- a resistor coupled between the base terminal of the transistor and the GND pad; and
- wherein a voltage that is less than the sum of the Vbr1, Vgs, and Vbr2 voltages, but greater than the sum of the Vbr1 and Vgs voltages, is applied between the I/O pad and the GND pad, the source terminal of the n-channel depletion mode MOS transistor is clamped to a voltage substantially equal to the sum of the Vbr1 and Vgs voltages.

9. A ESD protection structure coupled between an I/O pad and a GND pad, the structure comprising:
- a n-channel depletion mode MOS transistor having a drain terminal, a gate terminal, and a source terminal, and having a drain-to-source break down voltage Vbr2, and having a drain-to-source saturation current of Isat, wherein the drain terminal is coupled to the I/O pad, and the gate and source terminals are coupled together;
- a zener diode having a cathode terminal and an anode terminal, and having a break down voltage Vbr1, wherein the cathode terminal is coupled to the gate of the n-channel depletion mode MOS transistor;
- a npn bipolar transistor having a collector terminal, a base terminal, and an emitter terminal, wherein the collector terminal is coupled to the source terminal of the n-channel depletion mode MOS transistor, the base terminal is coupled to the anode terminal of the diode, and the emitter terminal is coupled to the GND pad, and wherein the npn bipolar transistor is activated, a voltage Vbe is developed between the base and emitter terminals;
- a resistor coupled between the base terminal of the transistor and the GND pad; and
- wherein a voltage that is less than the sum of the Vbr1, Vbe, and Vbr2 voltages is applied between the I/O pad and the GND pad, a drain-to-source current of the n-channel depletion mode MOS transistor, limited to a maximum current level of Isat, is generated.

\* \* \* \* \*